United States Patent
Wu et al.

(10) Patent No.: US 10,979,081 B2
(45) Date of Patent: *Apr. 13, 2021

(54) POLAR CODE INTERLEAVING AND BIT SELECTION

(71) Applicant: MEDIATEK INC., Hsin-Chu (TW)

(72) Inventors: Wei-De Wu, Hsin-Chu (TW); Chia-Wei Tai, Hsin-Chu (TW)

(73) Assignee: MediaTek INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/550,485

(22) Filed: Aug. 26, 2019

(65) Prior Publication Data

US 2020/0014405 A1      Jan. 9, 2020

Related U.S. Application Data

(63) Continuation of application No. 15/889,204, filed on Feb. 6, 2018, now Pat. No. 10,425,111.

(Continued)

(51) Int. Cl.
*H03M 13/27*      (2006.01)
*H03M 13/00*      (2006.01)
(Continued)

(52) U.S. Cl.
CPC ....... *H03M 13/2792* (2013.01); *H03M 13/13* (2013.01); *H03M 13/2778* (2013.01);
(Continued)

(58) Field of Classification Search
CPC ........... H03M 13/2792; H03M 13/005; H03M 13/13; H03M 13/2778; H03M 13/618;
(Continued)

(56) References Cited

U.S. PATENT DOCUMENTS 10,009,146 B2 *   6/2018   Shen ............... H03M 13/13
10,148,289 B2 *   12/2018  Shen ............ H03M 13/2792
(Continued)

FOREIGN PATENT DOCUMENTS

CN        102122966 A     4/2011
CN        106027068 A     3/2015
(Continued)

OTHER PUBLICATIONS

M. El-Khamy, H. Lin, J. Lee, H. Mandavifar and I. Kang, "HARQ Rate-Compatible Polar Codes for Wireless Channels," 2015 IEEE Global Communications Conference (GLOBECOM), San Diego, CA, 2015, pp. 1-6 (Year: 2015).*

(Continued)

*Primary Examiner* — Kyle Vallecillo
(74) *Attorney, Agent, or Firm* — Imperium Patent Works; Helen Mao; Zheng Jin

(57) ABSTRACT

Apparatus and methods are provided for polar code sub-block interleaving and bit selection. In one novel aspect, middle-part interlaced sub-block interleaving is provided for polar code interleaving. In one embodiment, the middle part of the polar code is interlaced and generates the interleaved polar code. In another embodiment, the lower part and the upper part are also sub-block interleaved with the middle-part interlaced method. In another novel, rate-dependent unified bit selection is provided. The bit selection is categorized into three operation categories of repetition, puncturing and the shortening. Each category follows unified bit selection rule with different categories differ only in the access scheme. In one embodiment, the circular buffer is used for bit selection.

20 Claims, 7 Drawing Sheets

Related U.S. Application Data

(60) Provisional application No. 62/550,780, filed on Aug. 28, 2017, provisional application No. 62/549,482, filed on Aug. 24, 2017, provisional application No. 62/526,422, filed on Jun. 29, 2017, provisional application No. 62/455,054, filed on Feb. 6, 2017.

(51) Int. Cl.
*H04L 1/00* (2006.01)
*H03M 13/13* (2006.01)

(52) U.S. Cl.
CPC ..... *H03M 13/618* (2013.01); *H03M 13/6306* (2013.01); *H03M 13/6356* (2013.01); *H03M 13/6362* (2013.01); *H03M 13/6368* (2013.01); *H04L 1/0057* (2013.01); *H04L 1/0071* (2013.01)

(58) Field of Classification Search
CPC ......... H03M 13/6306; H03M 13/6356; H03M 13/6368; H04L 1/0071
See application file for complete search history.

(56) References Cited

U.S. PATENT DOCUMENTS

| | | | |
|---|---|---|---|
| 10,742,350 B2* | 8/2020 | Jang | H04L 1/0068 |
| 2009/0067543 A1 | 3/2009 | Hsiao et al. | 375/298 |
| 2013/0283128 A1 | 10/2013 | Lee et al. | 714/773 |
| 2014/0108748 A1 | 4/2014 | Lee et al. | 711/154 |
| 2014/0208183 A1* | 7/2014 | Mahdavifar | H03M 13/296 714/755 |
| 2015/0077277 A1 | 3/2015 | Alhussien et al. | 341/67 |
| 2015/0092886 A1 | 4/2015 | Ionita et al. | 375/298 |
| 2015/0236715 A1 | 8/2015 | Alhussien et al. | 341/67 |
| 2015/0333769 A1 | 11/2015 | Jeong et al. | 714/790 |
| 2016/0182187 A1 | 6/2016 | Kim et al. | 714/807 |
| 2016/0248547 A1 | 8/2016 | Shen et al. | 714/790 |
| 2016/0269050 A1* | 9/2016 | Shen | H04L 1/0071 |
| 2016/0285479 A1* | 9/2016 | El-Khamy | H03M 13/616 |
| 2016/0308644 A1 | 10/2016 | Shen et al. | 714/755 |
| 2016/0352464 A1 | 12/2016 | Shen et al. | 714/776 |
| 2016/0380763 A1 | 12/2016 | Ahn et al. | 380/270 |
| 2017/0005753 A1 | 1/2017 | Shen et al. | 375/261 |
| 2017/0012740 A1 | 1/2017 | Shen et al. | 714/776 |
| 2017/0047947 A1 | 2/2017 | Hong et al. | 714/755 |
| 2017/0230063 A1 | 8/2017 | Jeong et al. | |
| 2017/0250779 A1 | 8/2017 | Murakami et al. | |
| 2018/0097580 A1 | 4/2018 | Zhang et al. | |
| 2018/0191459 A1 | 7/2018 | Ge et al. | |

FOREIGN PATENT DOCUMENTS

| | | |
|---|---|---|
| EP | 2722993 A1 | 10/2012 |
| EP | 3098970 A1 | 2/2014 |
| WO | WO2015123842 A1 | 2/2014 |
| WO | WO2015139248 A1 | 3/2014 |

OTHER PUBLICATIONS

H. Mandavifar, M. El-Khamy, J. Lee and I. Kang, "Polar Coding for Bit-Interleaved Coded Modulation," in IEEE Transactions on Vehicular Technology, vol. 65, No. 5, pp. 3115-3127, May 2016 (Year: 2016).*
USPTO, office action for MTKI-17-083US/503219US dated Nov. 1, 2017 (9 pages).
EPO, search report for the EP patent application 17171096.5 dated Oct. 19, 2017 (12 pages).
EPO, search report for the EP patent application 17182093.9 dated Nov. 27, 2017 (10 pages).
3GPP TSG RAN WG! RAN1 #88 Meeting R1-1702735, MediaTek Inc., Polar Code Size and Rate-Matching Design for NR Control Channels, Athens, Greece, Feb. 13-17, 2017 (8 pages).
3GPP TSG RAN WG1 Meeting #89 R1-1707183, ZTE, Polar Codes Construction and Rate Matching Scheme, Hangzhou, China, May 15-19, 2017 (13 pages).
Valerio Bioglio et al, Low-Complexity Puncturing and Shortening of Polar Codes, Jan. 23, 2017 (6 pages).
3GPP TSG RAN WG1 AH_NR Meeting R1-1700168, MediaTek Inc., Polar Design features for Control Channels, Spokane, USA, Jan. 16-20, 2017 (8 pages).
International Search Report and Written Opinion of International Search Authority for PCT/CN2018/075465 dated May 21 28, 2018 (10 pages).
R1-1702735 3GPP TSG RAN WG1 RAN1 #88 Meeting, MediaTek Inc., "Polar Code Size and Rate-Matching Design for NR Control Channels", Athens, Greece, Feb. 13-17, 2017 (8 pages).
Taiwan IPO, search report for the TW patent application 107103957 (no English translation is available) dated Nov. 19, 2018 (4 pages).
USPTO, notice of allowance for the related U.S. Appl. No. 15/653,048 dated Apr. 5, 2019 (7 pages).
EPO, search report for the EP patent application 18747432.5 dated Oct. 23, 2020 (12 pages).
R1-1702735 3GPP TSG RAN WG! RAN1 #88 Meeting, MediaTek Inc., Polar Code Size and Rate-Matching Design for NR Control Channels, Athens, Greece, Feb. 13-17, 2017 (8 pages).
R1-1714179 3GPP TSG RAN WG1 #90, Samsung, "Rate Matching Scheme for Polar Codes", Prague, Czechia, Aug. 21-25, 2017 (7 pages).
R1-1707183 3GPP TSG RAN WG1 Meeting #89, ZTE, Polar Codes Construction and Rate Matching Scheme, Hangzhou, China, May 15-19, 2017 (13 pages).

* cited by examiner

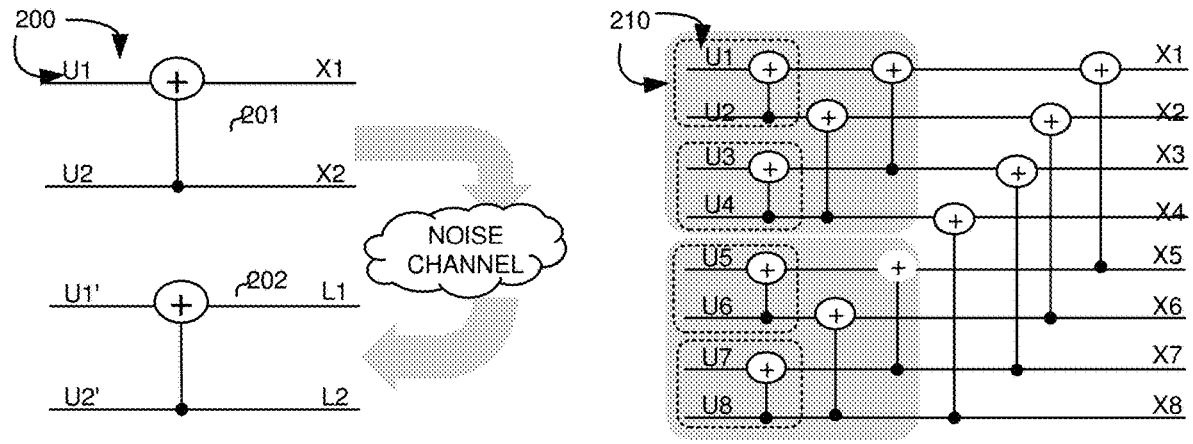
FIG. 2A
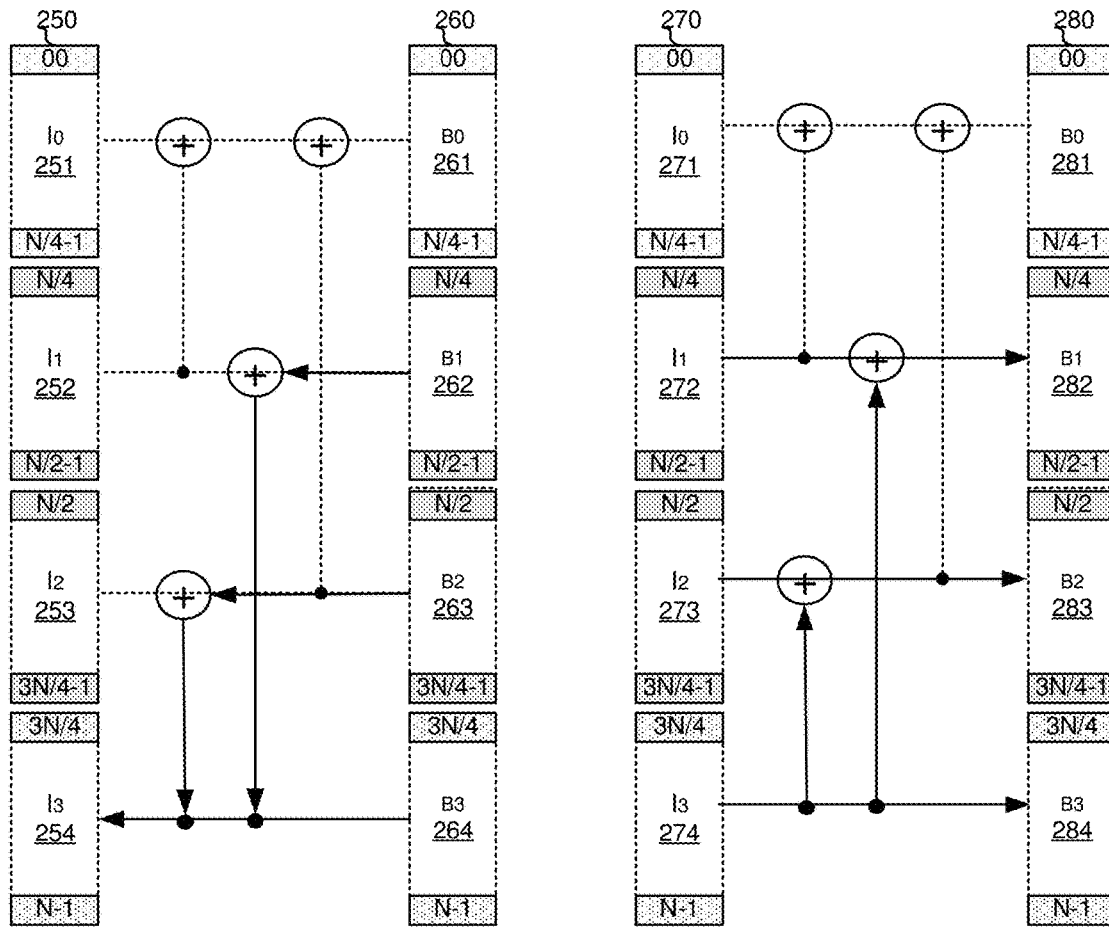
FIG. 2B
FIG. 2C ized for the repetition and puncturing operations in accordance with embodiments of the current invention.

POLAR CODE INTERLEAVING AND BIT SELECTION

CROSS REFERENCE TO RELATED APPLICATIONS

This application is a continuation, and claims priority under 35 U.S.C. § 120 from nonprovisional U.S. patent application Ser. No. 15/889,204, entitled "Polar Code Interleaving and Bit Selection," filed on Feb. 6, 2018, the subject matter of which is incorporated herein by reference. Application Ser. No. 15/889,204, in turn, claims priority under 35 U.S.C. § 119 from U.S. Provisional Application No. 62/455,054 entitled "Unified Polar Code Rate-Matching Design" filed on Feb. 6, 2017; U.S. Provisional Application No. 62/526,422, entitled "Circular Buffer Access Design for Polar Rate-Matching", filed on Jun. 29, 2017; U.S. Provisional Application No. 62/549,482, entitled "Polar Code Rate Matching Design", filed on Aug. 24, 2017, and U.S. Provisional Application No. 62/550,780, entitled "Polar Code Rate-Matching Design", filed on Aug. 28, 2017, the subject matters of each of the foregoing applications are incorporated herein by reference.

TECHNICAL FIELD

The disclosed embodiments relate generally to wireless communication, and, more particularly, to polar code interleaving and bit selection.

BACKGROUND

Channel coding plays an important role in the wireless communication network. It improves transmission quality when the signal encounters various disturbances such as noise, interference, and multipath propagation. The tradeoff is the increased number of transmission bits. Polar code is one of the channel coding schemes used for the next generation wireless data communication. A polar code is a linear block error correcting code. The code is constructed using multiple recursive concatenation of a short kernel code. When the number of the recursions becomes large, the mother code size N of the polar code size may exceed the physical code bit size. In the wireless network, a rate matching and bit selection are required for polar code channel coding. Further interleaving is used in the wireless communication network for improved quality.

Improvements and enhancements are required for polar code interleaving and bit selection.

SUMMARY

Apparatus and methods are provided for polar code interleaving and bit selection. In one novel aspect, middle-part interlaced sub-block interleaving is provided for polar code interleaving. In one embodiment, the polar code is divided in sequence into the lower part, the middle part and the upper part. The middle part of the polar code is interlaced and generates the interleaved polar code. In another embodiment, the lower part and the upper part are also sub-block interleaved with the middle-part interlaced method.

In another novel, rate-dependent unified bit selection is provided. The bit selection is categorized into three categories of repetition, puncturing and the shortening. Each category follows unified bit selection rule with different categories differ only in the access scheme. In one embodiment, the top-to-bottom approach is used for all three categories. In another embodiment, the bottom-to-top approach is used for all three categories. In other embodiments, a combination of bottom-to-top and top-to-bottom approaches for different categories are used.

In one embodiment, the UE divides in sequence a polar code into a lower part, a middle part, and an upper part, wherein the polar code has a polar code length N, performs a rate-independent interlaced sub-block interleaving for the middle part of the polar code to obtain an interleaved bit sequence, and performs a rate-dependent bit selection from the interleaved bit sequence based on the output length E to obtain a transmission bit sequence. In one embodiment, the bit selection is categorized to bit-selection operations comprising: a repetition operation with E greater than or equal to N, a puncturing operation with E smaller than N and a polar code rate smaller than or equal to a predefined threshold T, and a shortening operation with E smaller than N and a polar code rate is greater than T. In one embodiment, the bit selection operation is the repetition operation, and wherein the transmission bit sequence from index 0 to E is selected starting from a lowest index of the interleaved bit sequence and repeated from the lowest index of the interleaved bit sequence. In another embodiment, the bit selection operation is the puncturing operation, and wherein the transmission bit sequence from index 0 to E is selected starting from index (N-E) of the interleaved bit sequence to index N of the interleaved bit sequence. In yet another embodiment, the bit selection operation is the shortening operation, and wherein the transmission bit sequence from index 0 to E is selected starting from a lowest index of the interleaved bit sequence to index E of the interleaved bit sequence.

In one embodiment, the interleaved bit sequence is set in an interleaved circular buffer. The transmission bit sequence is selected from index 0 of the circular buffer in sequence for the repetition operation, the transmission bit sequence is selected from index N-E of the circular buffer in sequence for the puncturing operation, and the transmission bit sequence is selected from index 0 of the circular buffer in sequence for the shortening operation.

This summary does not purport to define the invention. The invention is defined by the claims.

BRIEF DESCRIPTION OF THE DRAWINGS

The accompanying drawings, where like numerals indicate like components, illustrate embodiments of the invention.

FIG. 2A illustrates exemplary diagrams of polar code implementation in accordance with embodiments of the current invention.

FIG. 2B illustrates exemplary diagrams of segment realization for the repetition and puncturing operations in accordance with embodiments of the current invention.

FIG. 2C illustrates exemplary diagrams of segment realization for shortening operations in accordance with embodiments of the current invention.

DETAILED DESCRIPTION

Reference will now be made in detail to some embodiments of the invention, examples of which are illustrated in the accompanying drawings.

Figure 1:
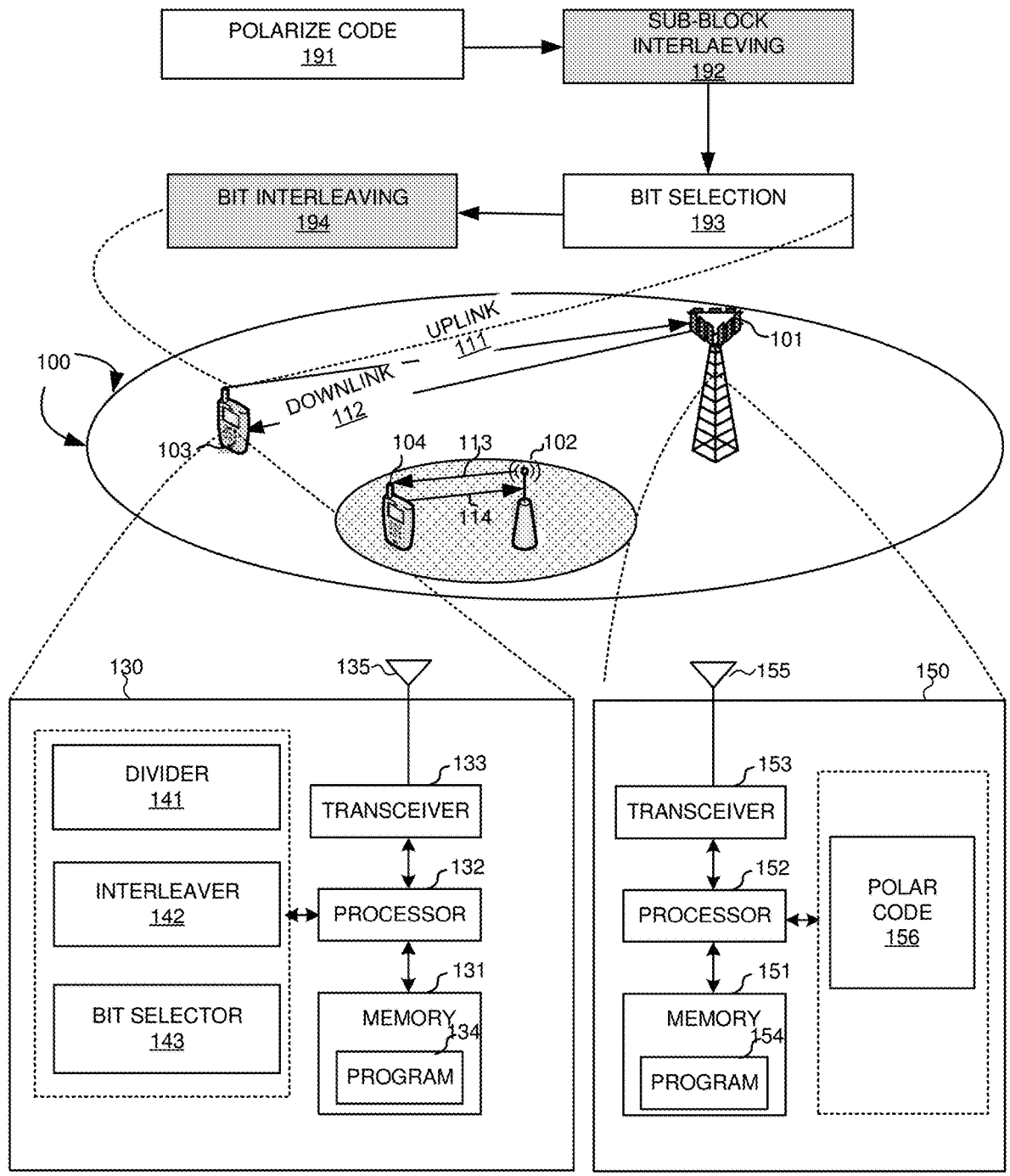
FIG. 1 is a schematic system diagram illustrating an exemplary polar code interleaving and bit selection in a wireless network in accordance with embodiments of the current invention.

FIG. 1 is a schematic system diagram illustrating an exemplary polar code interleaving and bit selection in a wireless network 100 in accordance with embodiments of the current invention. The base unit may also be referred to as an access point, an access terminal, a base station, a Node-B, an eNode-B (eNB), a gNB, or by other terminology used in the art. In FIG. 1, the one or more base stations 101 and 102 serve several remote units/user equipment (UEs) 103 and 104 within a serving area, for example, a cell, or within a cell sector. In some systems, one or more base stations are communicably coupled to a controller forming an access network that is communicably coupled to one or more core networks. The disclosure, however, is not intended to be limited to any particular wireless communication system.

Generally, serving base stations 101 and 102 transmit downlink communication signals 112 and 113 to UEs or mobile stations in the time and/or frequency domain. UEs or mobile stations 103 and 104 communicate with one or more base stations 101 and 102 via uplink communication signals 111 and 114. UE or the mobile station may also be referred to as a mobile phone, laptop, and mobile workstation and so on. In FIG. 1, the wireless communication system 100 is an OFDM/OFDMA system comprising base stations gNB 101 and gNB 102 and a plurality of UE 103 and UE 104. When there is a downlink packet to be sent from the gNB to the UE, each UE gets a downlink assignment, e.g., a set of radio resources in a physical downlink shared channel (PDSCH). When a UE needs to send a packet to gNB in the uplink, the UE gets a grant from the gNB that assigns a physical uplink shared channel (PUSCH) consisting of a set of uplink radio resources. In a wireless network, channel coding is used to overcome disturbances to the signals. Polar code is adopted by 5G as the channel coding. Interleaving is used for the polarized code to achieve better quality. Since the polar coding may have a large size mother code exceeding the transmission bit size, rate matching is required for transmission. Based on the rate matching, bit selection is performed.

FIG. 1 further illustrates simplified block diagrams 130 and 150 for UE 103 and gNB 101, respectively. UE 103 has an antenna 135, which transmits and receives radio signals. A RF transceiver module 133, coupled with the antenna, receives RF signals from antenna 135, converts them to baseband signals and sends them to processor 132. RF transceiver 133 also converts received baseband signals from processor 132, converts them to RF signals, and sends out to antenna 135. Processor 132 processes the received baseband signals and invokes different functional modules to perform features in UE 103. Memory 131 stores program instructions 134 and data to control the operations of UE 103.

UE 103 also includes multiple function modules that carry out different tasks in accordance with embodiments of the current invention. A divider 141 divides in sequence a polar code into a lower part, a middle part, and an upper part, wherein the polar code has a polar code length N. An interleaver 142 performs a rate-independent interlaced sub-block interleaving for the middle part of the polar code to obtain an interleaved bit sequence. A bit selector 143 performs a rate-dependent bit selection from the interleaved bit sequence based on an output length E to obtain a transmission bit sequence.

Also shown in FIG. 1 is exemplary block diagram for gNB 101. gNB 101 has an antenna 155, which transmits and receives radio signals. A RF transceiver module 153, coupled with the antenna, receives RF signals from antenna 155, converts them to baseband signals, and sends them to processor 152. RF transceiver 153 also converts received baseband signals from processor 152, converts them to RF signals, and sends out to antenna 155. Processor 152 processes the received baseband signals and invokes different functional modules to perform features in gNB 101. Memory 151 stores program instructions 154 and data to control the operations of gNB 101. gNB 101 also includes function modules that carry out different tasks in accordance with embodiments of the current invention. A polar code 156 performs functions to support polar code interleaving and bit selection functions.

FIG. 1 further illustrates functional steps of polar code handling. At step 191, the UE performs channel coding using polar code. The polar code is obtained through the recursive construction with a bit length $N=2^n$. At step 192, the UE performs sub-block interleaving for the polarized code block. In one novel aspect, middle part interlaced sub-block interleaving is used for polar code interleaving. The transmission channel with a bit length E may be smaller than the mother polar code size N. The output length E is determined based on the input bit size K, such that the ratio of K/N is matched to a targeted code rate R. At step 193, the bit selection is performed based on the output length E. In one embodiment, the bit selection is categorized in predefined operations. At step 194, bit interleaving is performed.

FIG. 2A illustrates exemplary diagrams of polar code implementation in accordance with embodiments of the current invention. Polar code is designed to partially polarize the input channels. A polar code 200 has an encoding 201 with inputs U1 and U2 and output X1 and X2. The encoded bits are transmitted over a noise channel. On the receiver side, A polar code decoder 202 with inputs of L1 and L2 and outputs U1' and U2'. The polar code is recursively constructed with concatenation of encoding 201. The recursive construction 210 has four-set of concatenated encoders with inputs U1,U2, . . . U8. The outputs X1,X2, . . . X8 are recursively constructed with a length $N=2^n$. When the number of recursions becomes large, the virtual channels tend either have high reliability or low reliability and the data bits are allocated to the most reliable channels.

In one novel aspect, the polar code input and output are factored into segments. Based on the maximum polar code size, the output sequence length, and the code rate, the bit selection is categorized into three operations including the puncturing operation, the shortening operation and the repetition operation. By first performing an rate-independent interleaving, different bit selection operations are coordinated in rate-dependent accessing into a common buffer of interleaved coded bits such that a unified polar code rate matching design is achieved. FIG. 2B and FIG. 2C illustrate the symmetry of selecting the coded bits for different bit selection operations so that the unified rate-matching design can be realized.

FIG. 2B illustrates exemplary diagrams of selecting the coded bits for the repetition and puncturing operations in accordance with embodiments of the current invention. Input bits 250 are segmented to I0 251, I1 252, I2 253, and I3 254. Output bits 260 are segmented to B0 261, B0 262, B2 263, and B3 264. Since most of data bits will be allocated in input segment I3, the related output coded bits in B3, B2, and B1 should be selected for transmission so as to preserve polar code polarization gain. Since B3 is directly connected to I3, and B2 and B1 are assisting segments to I3, B3 should be selected first, and B2 and B1 should be evenly utilized if allowed. Note that the selection operation can also be done in sub-block manner if the input and output segments consist of small sub-blocks of equal bit number.

FIG. 2C illustrates exemplary diagrams of selecting coded bits for shortening operations in accordance with embodiments of the current invention. Input bits 270 are segmented to I0 271, I1 272, I2 273, and I3 274. Output bits 280 are segmented to B0 281, B0 282, B2 283, and B3 284. In case of higher code rate, more better-quality input bit channels should be available for carrying more information bits. Since I3 will interfere most input sub-blocks (e.g. I2 and I1 outputs), having the bits in I3 set to zero can reduce the interference to I2 and I1, thus creating more bit channels of better quality. This will in turn give zero known bits in B3 which can be dropped as receiver also knowns these constant zero. In case B3 are all dropped, one can evenly set zero bits to I2 and I1 in a bottom-up manner as they both interference I0. The corresponding zero known bits in B2 and B1 can be evenly dropped accordingly. Note that the selection operation can also be done in sub-block manner if the input and output segments consist of small sub-blocks of equal bit number. It is also observed that the final non-dropped/selected coded bits for shortening are complementary to those for puncturing, which means the two types of operations can utilize a common interleaving on encoder output bits before accessing to the complementary parts of the interleaved coded bits or sub-blocks.

In one novel aspect, a middle part interlaced interleaving is provided for polar code interleaving. A code block is first sub-blocked into multiple sub blocks. The sub blocks in the middle of the code block is interlaced creating a new interleaved code block.

Figure 3:
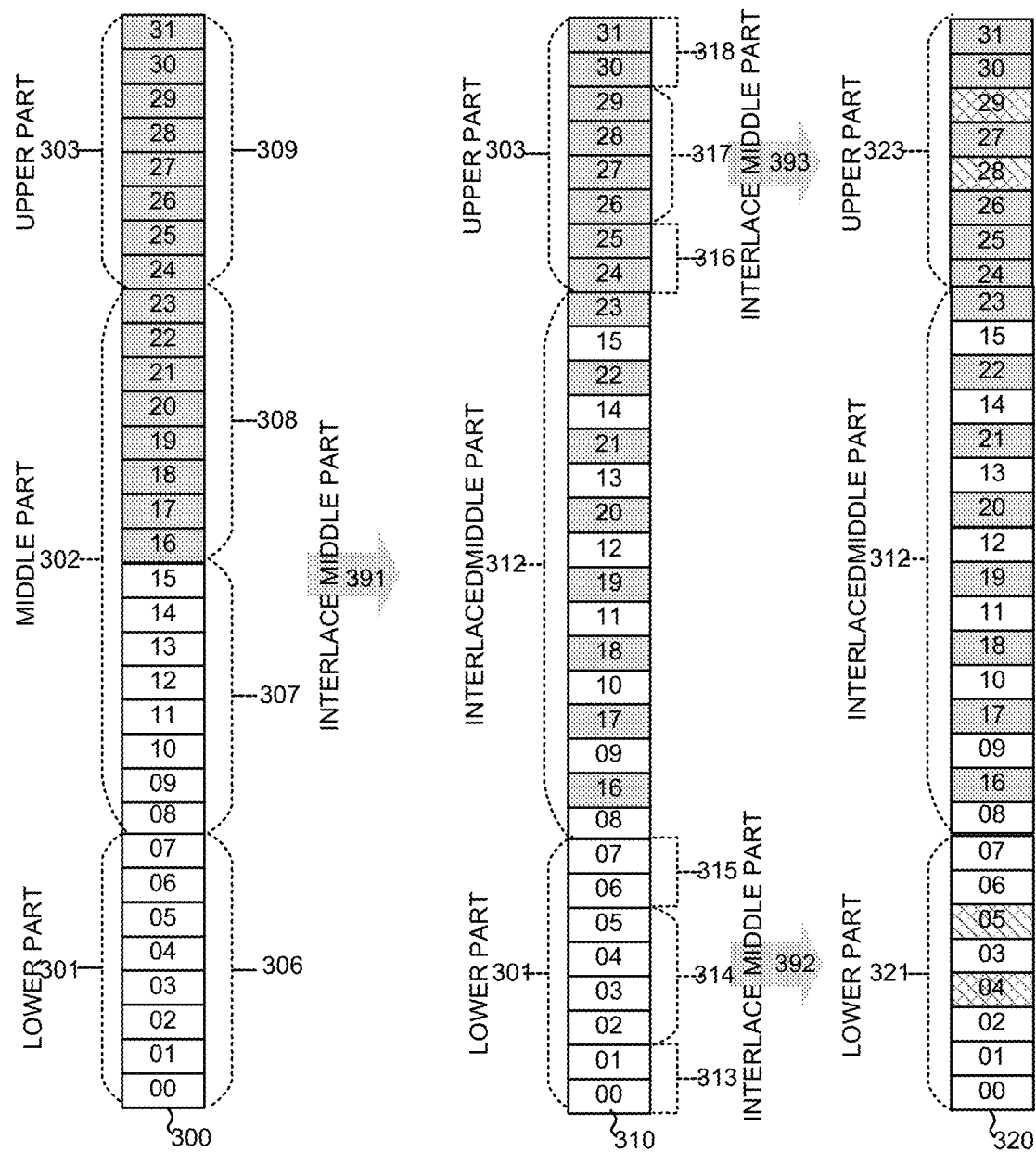
FIG. 3 illustrates exemplary diagrams for polar code interleaving with middle part interlaced in accordance with embodiments of the current invention.

FIG. 3 illustrates exemplary diagrams for polar code interleaving with middle part interlaced in accordance with embodiments of the current invention. Interleaving data improves error correction performance for a data communication system. A polar code 300 is equally segmented ascendingly into four parts, segments 306, 307, 308, and 309. In one embodiment, two of the middle segments 307 and 308 are grouped together as middle part 302. The lower-indexed segment 306 is lower part 301 and the higher-indexed segment 309 is upper part 303. An interlaced interleaving is performed at the middle part 302 in step 391. Middle part 302 is equally divided into two parts such as segment 307 and segment 308. Each sub-block in segment 307 block is followed by a sub-block in segment 308 block in sequence. The interlaced middle part 312 and the lower part 301 and upper part 302 forms the interleaved code block 310. Although code 300 is shown to be divided into four segments and the middle two segments are interleaved, input code bits can be divided in other ways. The size and the location of the middle part can be configured or predefined.

In another embodiment, in addition to perform interleaving on the middle part, interleaving is further performed on the lower part and/or the upper part as well. In one embodiment, the same middle part interlaced interleaving is performed for both the lower part 301 and the upper part 303. Lower part 301 is divided into three sub-parts: a lower part 313, a middle part 314, and an upper part 315. In the similar way, middle part 314 is interlaced at step 392. The middle-part interleaved lower part 301 becomes lower part 321 in code block 320. Similarly, upper part 303 is divided into three parts including a lower part 316, a middle part 317, and an upper part 318. Middle part 317 is interlaced. The middle-part interleaved upper part 303 becomes upper part 323 in code block 320. Code block 320 comprises the interleaved middle part 312, the middle-part-interleaved lower part 321, and the middle-part-interleaved upper part 323. Both code 310 and code 320 are interleaved polar codes. They both provide enhanced error correction coding.

The middle-part interleaved polar code provides an efficient way for a better-performed polar code. Two specific examples are given following the method provided.

Figure 4A:
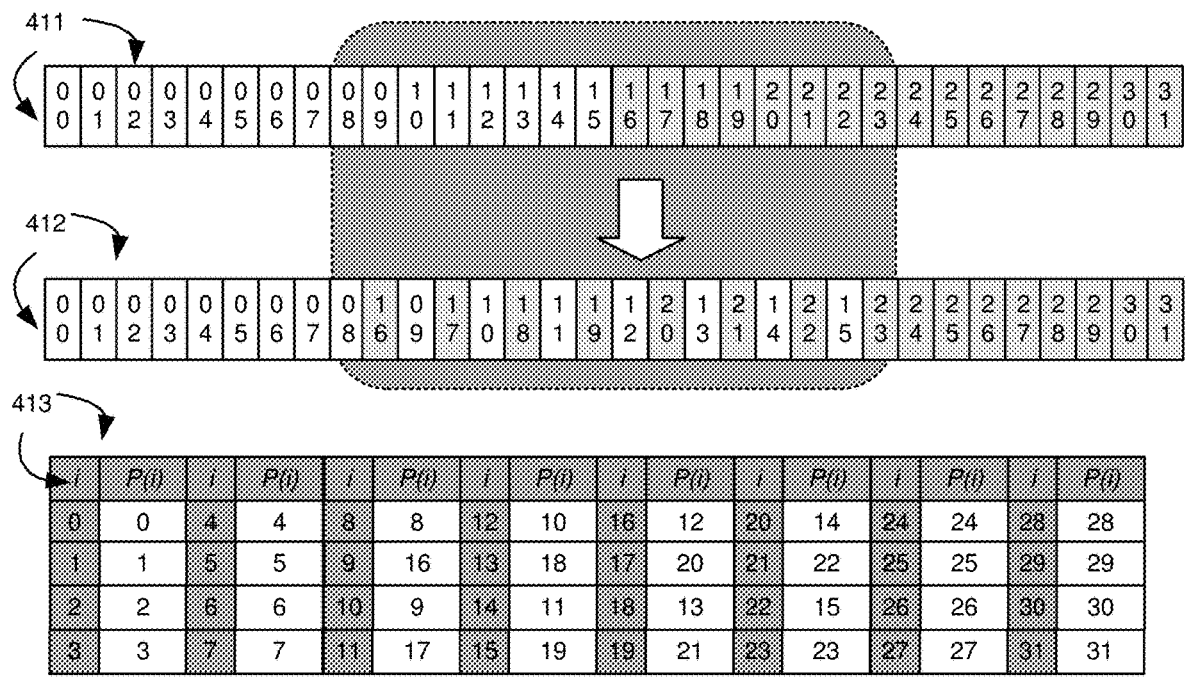
FIG. 4A shows exemplary diagrams and a table for middle-part interleaved polar code without interleaving the lower part and the upper part in accordance with embodiments of the current invention.

FIG. 4A shows exemplary diagrams and a table for middle-part interleaved polar code without interleaving the lower part and the upper part in accordance with embodiments of the current invention. Input bits of in input block code 411 are divided into 32 sub-blocks indexed 0-31. The 32 sub-blocks are grouped to three parts, lower part with sub-blocks 0-7, middle part with sub-blocks 8-23, and upper part with sub-blocks 24-31. Sub-blocks of middle part are equally divided into two parts A and B. Sub-blocks of middle part are interlaced in the manner of ABABAB. Sub-blocks of the lower part and the upper part remain the same. Code block 412 represents the interleaved code. Table 413 illustrates sub-block interleaver pattern P(i).

Figure 4B:
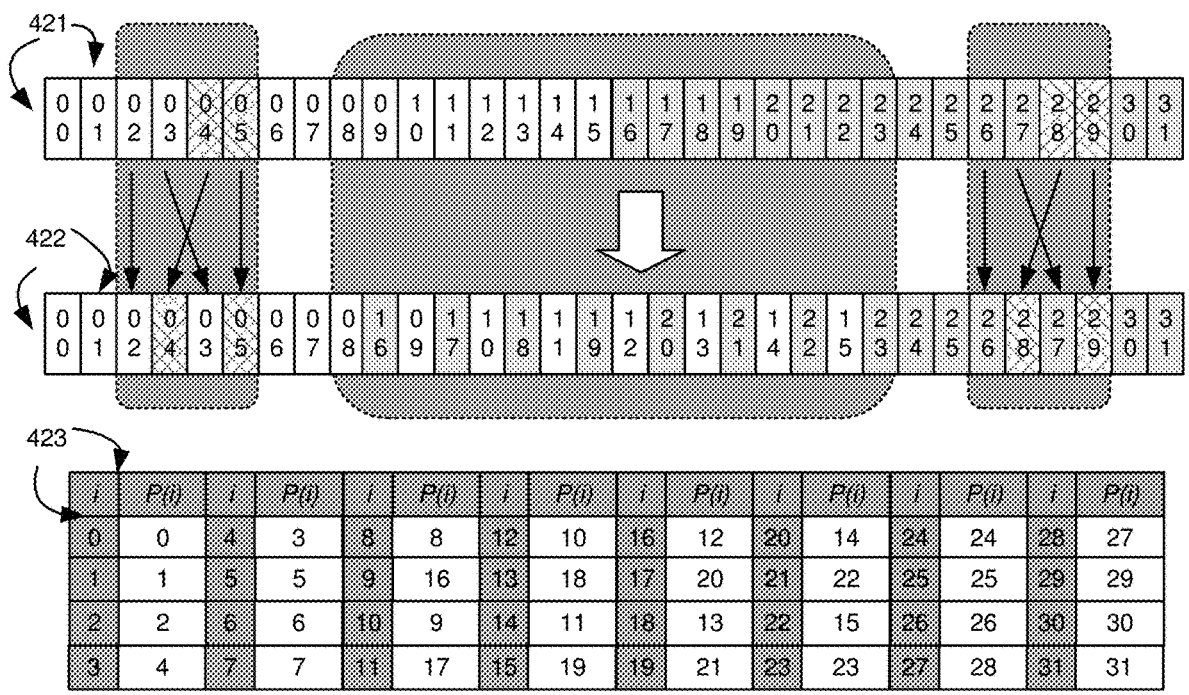
FIG. 4B shows exemplary diagrams and a table for middle-part interleaved polar code with middle-part interlaced lower part and upper part in accordance with embodiments of the current invention.

FIG. 4B shows exemplary diagrams and a table for middle-part interleaved polar code with middle-part interlaced lower part and upper part in accordance with embodiments of the current invention. Input bits of input code block 421 are divided into 32 sub-blocks indexed 0-31. The 32 sub-blocks are grouped to three parts, lower part with sub-blocks 0-7, middle part with sub-blocks 8-23, and upper part with sub-blocks 24-31. Sub-blocks of middle part are equally divided into two parts A and B. Sub-blocks of middle part are interlaced in the manner of ABABAB. Sub-blocks of the lower part and the upper part are interleaved with corresponding middle part interlaced. Code block 422 represents the interleaved code. Table 423 illustrates sub-block interleaver pattern P(i).

Rate matching is required when the encoded data block is greater than the transmission block size. The basic function of rate matching is to match the number of bits in the transport block to the number of bits that can be transmitted in a given allocation. In step of the rate matching for the polar code, the number of transmission block size E and the maximum polar code size N is considered. The rate matching subsequently categorizes the transmission into different categories. In one novel aspect, the interleaving for the polar code is rate independent as shown above. Regardless of the rate of the transmission, the same interleaving method is used. The bit selection, however, is rate-dependently based on the category determined by the rate matching. For the repetition group, a subset of the mother code is repeated. For the shortening operation, part of the mother code output bits are of known value(s) for both transmitter and receiver. Those code bits are not transmitted while the receiver uses large soft value(s) corresponding to the known value(s) in decoding. For the puncturing operation, part of the mother code output bits is not transmitted, and receiver uses zero soft values for those code bits in decoding.

Figure 5:
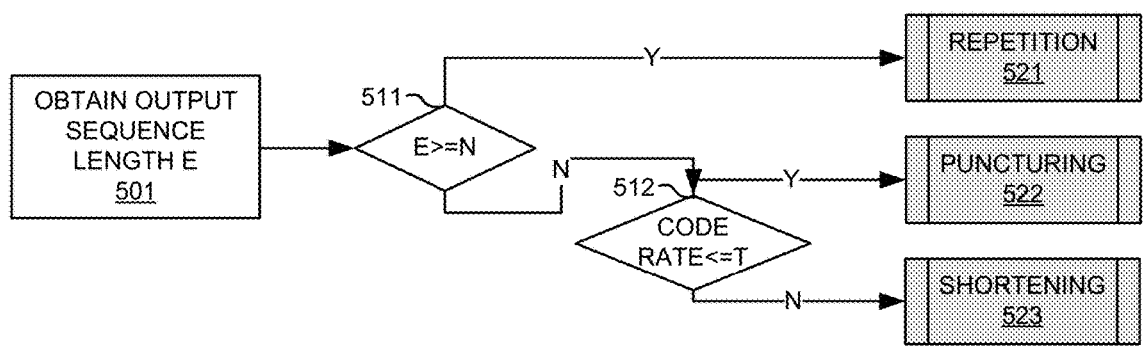
FIG. 5 shows exemplary flow chart of the polar code rate matching in accordance with embodiments of the current invention.

FIG. 5 shows exemplary flow chart of the polar code rate matching in accordance with embodiments of the current invention. At step 501, the output sequence length E of the data transmission is obtained. At step 511, the output sequence length E is compared with the polar code maximum length N. If the output sequence length E is greater than or equals to the polar code maximum length N, the rate matching determined the category being the repetition operation at step 521. If step 511 determines that the output sequence length E is smaller than the polar code maximum length N, it moves to step 512. At step 512, the polar code rate is compared with a predefined threshold T. If step 512 determines that the code rate is smaller than or equals to the threshold T, it categorizes to be puncturing at step 522. If step 512 determines that the code rate is greater than the threshold T, it categorizes to be shortening at step 523. The threshold T is used to switch puncturing or shortening. T is configurable or can be predefined. T can also be dynamically adjusted based on one or more predefined triggered events.

In one novel aspect, rate-dependent coded bit selection is performed for polar code. The bit selection uses unified rate-matching designs. For the same rate-matching category, a predefined bit selection rule applies.

Figure 6A:
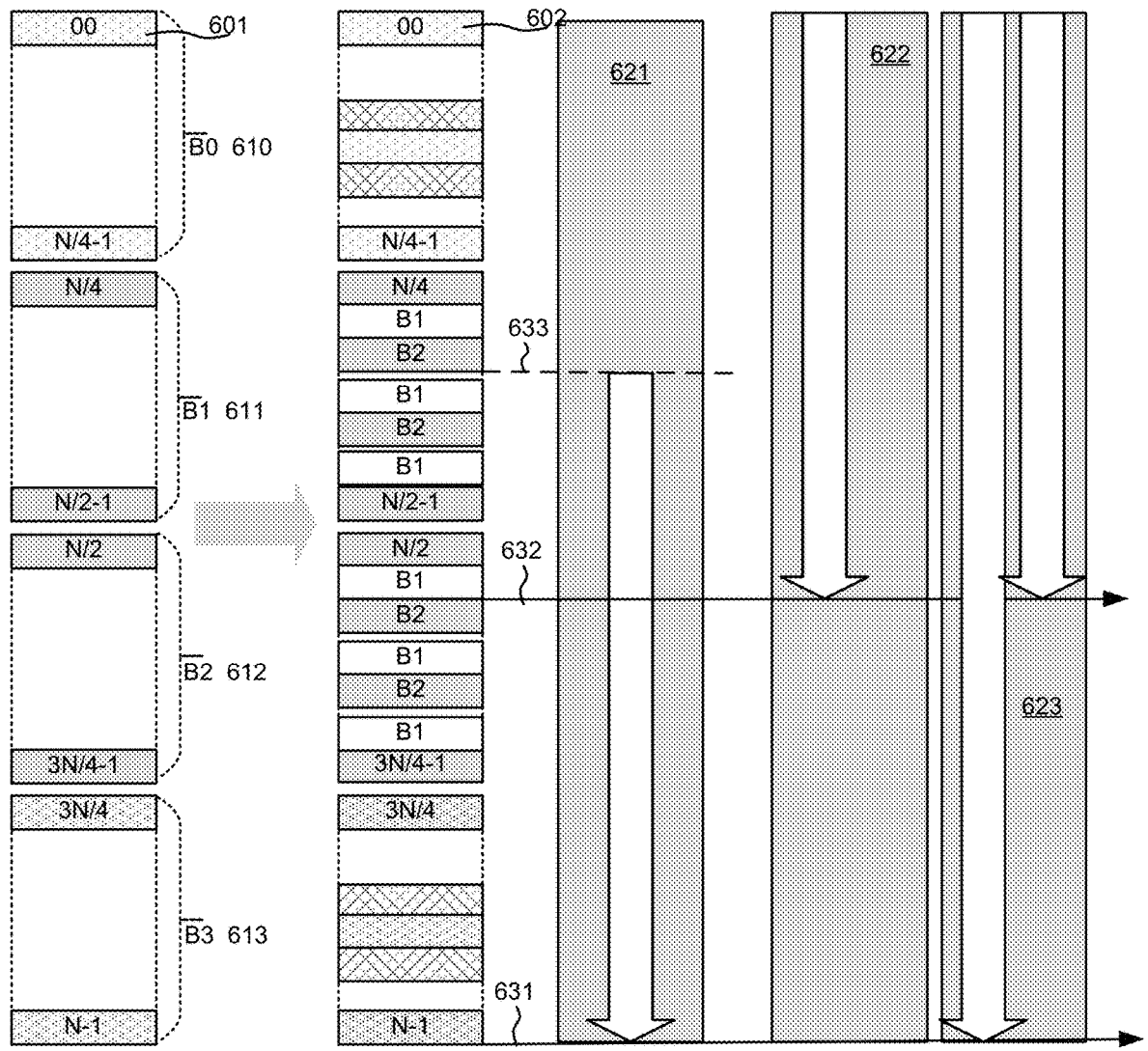
FIG. 6A illustrates exemplary diagrams for rate-dependent unified rate-matching bit selection with top to bottom approach in accordance with embodiments of the current invention.

FIG. 6A illustrates exemplary diagrams for rate-dependent unified rate-matching bit selection with top to bottom approach in accordance with embodiments of the current invention. A polar encoded code block 601 has a mother code length of N. In one embodiment, code block 601 is segmented into four segments B0 610, B1 611, B2 612, and B3 613. B0 610 includes code blocks 0-[(N/4)−1]. B1 611 includes code blocks (N/4) to [(N/2)−1]. B2 612 includes code blocks N/2 to [(3N/4)−1]. B3 613 includes code blocks (3N/4) to N−1. In one embodiment, code block is first interleaved to code 602. In one embodiment, code 602 is interleaved with the middle part B1 and B2 interlaced with the pattern of B1B2B1B2. In another embodiment, lower part B0 and upper B1 are also interleaved with corresponding middle part interlaced.

Different output bit rate is categorized into the repetition operation, the puncturing operation and the shortening operation. Bit selection follows the unified rule based on the different categories. Different categories of bit rate only differ in the way accessing into the re-arranged/interleaved code block 602. 621 shows an exemplary puncturing bit selection with an output bit sequence size of M. The bit selection starts from 633 with the index of N-M and selects the blocks from N-M to N−1 of code block 602. 622 shows an exemplary shortening bit selection with an output bit sequence size of M. The bit selection starts from index-0 of code block 602 until all the target bits are collect at 632 of index M. 623 illustrates an exemplary repetition bit selection with an output bit sequence size of M. The bit selection starts from the lowest index 0 to N−1 and wraps back until it meets all the output bits.

Figure 6B:
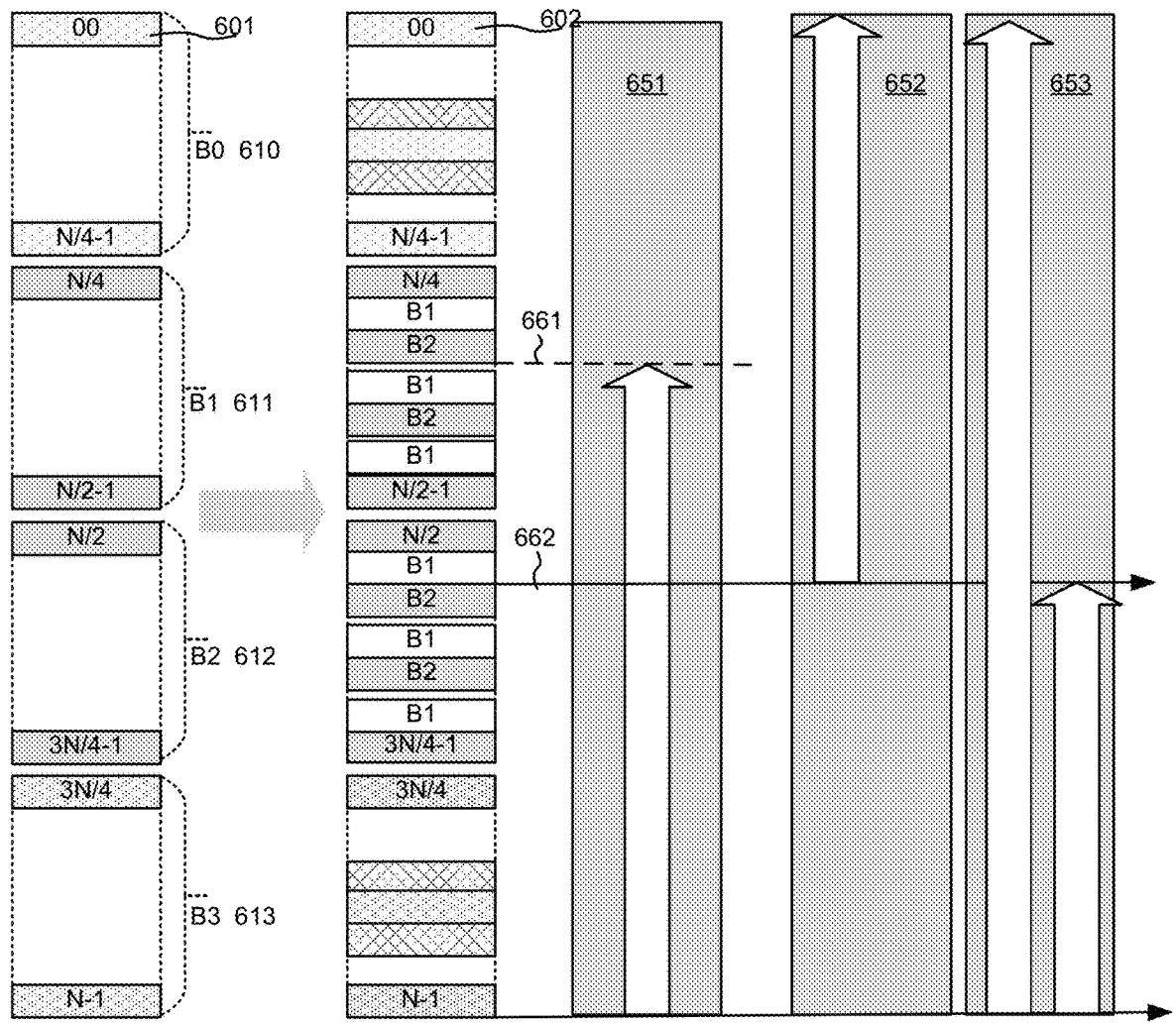
FIG. 6B illustrates exemplary diagrams for rate-dependent unified rate-matching bit selection with top to bottom approach in accordance with embodiments of the current invention.

FIG. 6B illustrates exemplary diagrams for rate-dependent unified rate-matching bit selection with top to bottom approach in accordance with embodiments of the current invention. Similar to the steps illustrated above, a polar encoded code block 601 has a mother code length of N. Code block 601 is segmented into four segments B0 610 including code blocks 0-[(N/4)−1]; B1 611 including code blocks (N/4) to [(N/2)−1]; B2 612 including code blocks N/2 to [(3N/4)−1]; and B3 613 including code blocks (3N/4) to N−1. In one embodiment, code 602 is interleaved with the middle part B1 and B2 interlaced with the pattern of B1B2B1B2. In another embodiment, lower part B0 and upper B1 are also interleaved with corresponding middle part interlaced.

Different output bit rate is categorized into the repetition operation, the puncturing operation and the shortening operation. Bit selection follows the unified rule based on the different categories. Different categories of bit rate only differ in the way accessing into the re-arranged/interleaved code block 602. The bottom-up accessing rule applies. 651 shows an exemplary puncturing bit selection with an output bit sequence size of M. The bit selection starts from highest index N−1 and selects the blocks from 661 N-M to 663 N−1 of code block 602. 652 shows an exemplary shortening bit selection with an output bit sequence size of M. The bit selection starts from 622 index N-M of code block 602 to the lowest index 0. 653 illustrates an exemplary repetition bit selection with an output bit sequence size of M. The bit selection starts from the highest index N−1 to the lowest index 0 and wraps back until it meets all the output bits.

In other embodiments, code block 602 can be factored in other number of ways without limited to equally divided into four segments. The bit rate-dependent unified bit selection illustrated can be independent of the interleaving step as well. Other embodiments of bit selection include different combination different rate-matching categories of the repetition, puncturing and shortening. For example, in one embodiment, the puncturing and the shortening follow the top-to-bottom approach as illustrated in FIG. 6A while the repetition follows the bottom-to-top approach as illustrated in FIG. 6B. In another embodiment, puncturing follows the bottom-to-top approach as illustrated in FIG. 6B while the shortening and repetition follow the top-to-bottom approach as illustrated in FIG. 6A. In yet another embodiment, puncturing and repetition follow the bottom-to-top approach as illustrated in FIG. 6B while the shortening follows the top-to-bottom approach as illustrated in FIG. 6A.

Figure 7:
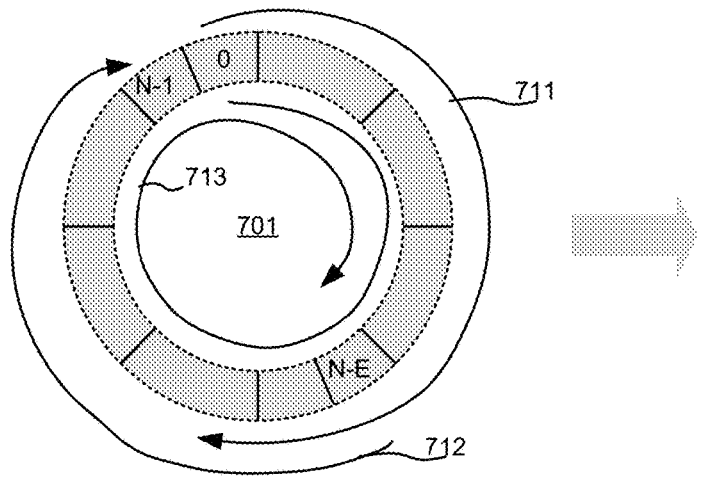
FIG. 7 illustrates exemplary diagrams for bit selection using a circular buffer in accordance with embodiments of the current invention.

FIG. 7 illustrates exemplary diagrams for bit selection using a circular buffer in accordance with embodiments of the current invention. In one embodiment, the bit sequence with length N after the sub-block interleaver, such as shown in table 423, is written into a circular buffer 701 with size of N and indexed from index-0 to index N−1. After a rate-matching for an output sequence with bit block size of E, different categorized transmissions use different access scheme to get the output sequence from circular buffer 701. 711 shows the access scheme for the shortening. The output sequence reads from index-0 to the length E−1. 712 shows the access scheme for the puncturing. The output sequence reads from index N-E to the N−1. 713 shows the access scheme for the repetition. The output sequence reads from index-0 and wraps around until the length of E is reached.

Circular buffer 701 can be used for other different approaches for different category. For example, with a bottom-to-top approach, the repetition reads from index N−1 backwards to index-0 and wraps around. Similarly, puncturing reads N-E backwards to index-0. Shortening reads from index N-1 backwards to N-E.

Figure 8:
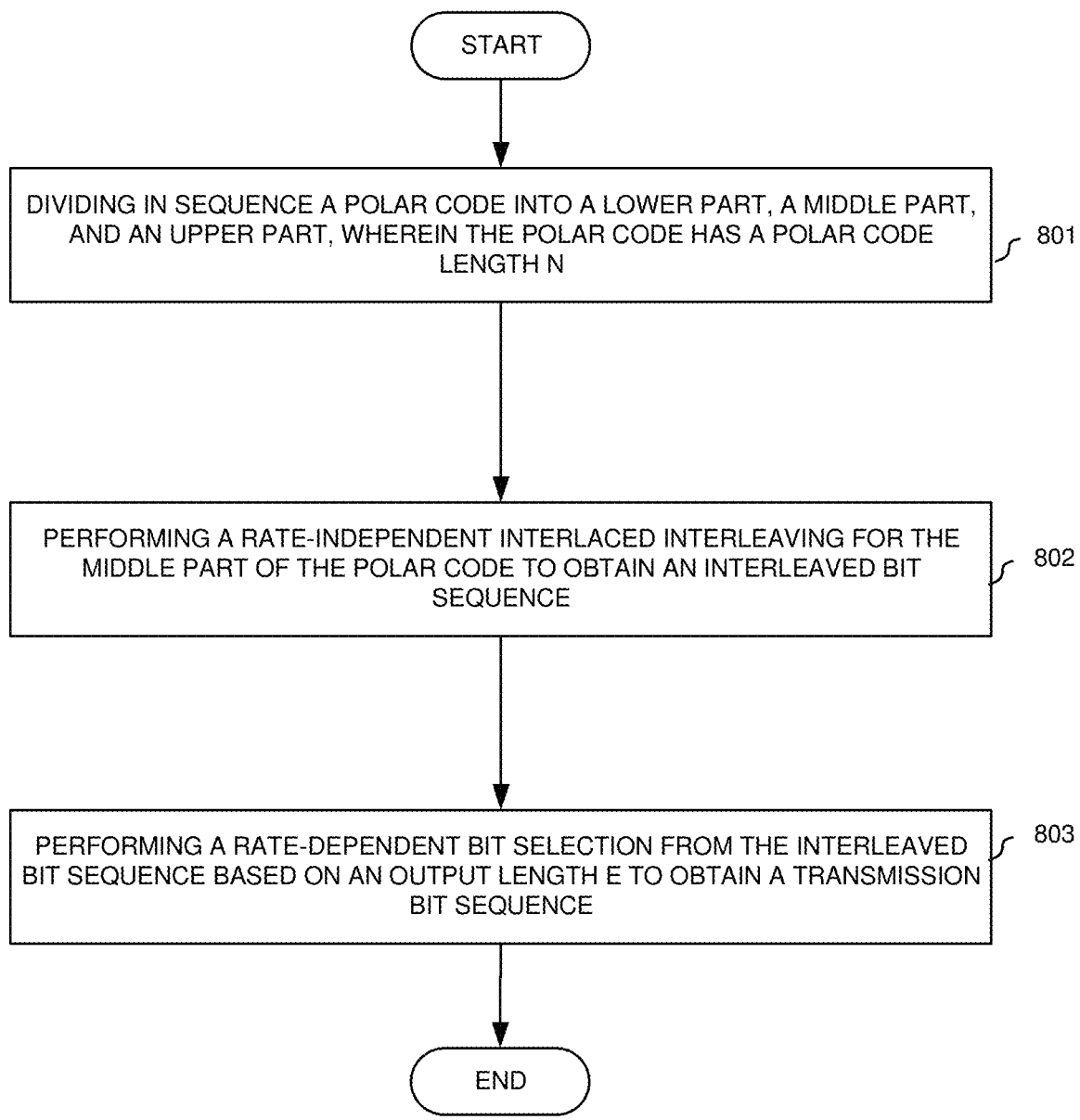
FIG. 8 illustrates an exemplary flow chart of the polar interleaving and bit selection process in accordance with embodiments of the current invention.

FIG. 8 illustrates an exemplary flow chart of the polar interleaving and bit selection process in accordance with embodiments of the current invention. At step 801, the UE divides in sequence a polar code into a lower part, a middle part, and an upper part, wherein the polar code has a polar code length N. At step 802, the UE performs a rate-independent interlaced interleaving for the middle part of the polar code to obtain an interleaved bit sequence. At step 803, the UE performs a rate-dependent bit selection from the interleaved bit sequence based on an output length E to obtain a transmission bit sequence.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A method comprising:
   dividing in sequence a polar code into a lower part, a middle part, and an upper part by a base station, wherein the polar code has a polar code length N;
   performing a rate-independent interlaced interleaving for the middle part of the polar code to obtain an interleaved bit sequence; and
   transmitting a transmission bit sequence, wherein the transmission bit sequence is generated by a rate-dependent bit selection from the interleaved bit sequence based on an output length E to obtain a transmission bit sequence.

2. The method of claim 1, wherein the bit selection is categorized to bit-selection operations comprising: a repetition operation with E greater than or equal to N, a puncturing operation with E smaller than N and a targeted code rate smaller than or equal to a predefined threshold T, and a shortening operation with E smaller than N and a targeted code rate greater than T.

3. The method of claim 2, wherein the bit selection operation is the repetition operation, and wherein the transmission bit sequence from index 0 to E is selected starting from a lowest index of the interleaved bit sequence and repeated from the lowest index of the interleaved bit sequence.

4. The method of claim 2, wherein the bit selection operation is the puncturing operation, and wherein the transmission bit sequence from index 0 to E is selected starting from index (N-E) of the interleaved bit sequence to index N of the interleaved bit sequence.

5. The method of claim 2, wherein the bit selection operation is the shortening operation, and wherein the transmission bit sequence from index 0 to E is selected starting from a lowest index of the interleaved bit sequence to index E of the interleaved bit sequence.

6. The method of claim 2, wherein the interleaved bit sequence is set in an interleaved circular buffer.

7. The method of claim 6, wherein the bit selection operation is selected from one of the circular buffer operations comprising: the repetition operation with the transmission bit sequence selected from index 0 of the circular buffer in sequence, the puncturing operation with the transmission bit sequence selected from index N-E of the circular buffer in sequence, and the shortening operation with the transmission bit sequence selected from index 0 of the circular buffer in sequence.

8. The method of claim 2, wherein the polar code is factored into segments, and wherein the interleaving for different bit selection is coordinated using a sub-block processing.

9. The method of claim 1, further comprising:
   performing a rate-independent interlaced sub-block interleaving for the upper part and the lower part of the polar code.

10. A base station, comprising:
   a transceiver that transmits and receives radio frequency (RF) signals from one or more wireless devices in a wireless network;
   a divider that divides in sequence a polar code into a lower part, a middle part, and an upper part, wherein the polar code has a polar code length N;
   an interleaver that performs a rate-independent interlaced interleaving for the middle part of the polar code to obtain an interleaved bit sequence; and
   a bit selector that performs a rate-dependent bit selection from the interleaved bit sequence based on an output length E to obtain a transmission bit sequence, wherein the transmission bit sequence is transmitted by the transceiver.

11. The base station of claim 10, wherein a rate matcher further categorizes the bit selection to bit-selection operations comprising: a repetition operation with E greater than or equal to N, a puncturing operation with E smaller than N and a targeted code rate smaller than or equal to a predefined threshold T, and a shortening operation with E smaller than N and the targeted code rate greater than T.

12. The base station of claim 11, wherein the bit selection operation is the repetition operation, and wherein the transmission bit sequence from index 0 to E is selected starting from a lowest index of the interleaved bit sequence and repeated from the lowest index of the interleaved bit sequence.

13. The base station of claim 11, wherein the bit selection operation is the puncturing operation, and wherein the transmission bit sequence from index 0 to E is selected starting from index (N-E) of the interleaved bit sequence to index N of the interleaved bit sequence.

14. The base station of claim 11, wherein the bit selection operation is the shortening operation, and wherein the transmission bit sequence from index 0 to E is selected starting from a lowest index of the interleaved bit sequence to index E of the interleaved bit sequence.

15. The base station of claim 11, wherein the interleaved bit sequence is set in an interleaved circular buffer.

16. The base station of claim 15, wherein the bit selection operation is the repetition operation, and wherein the transmission bit sequence is selected from index 0 of the circular buffer in sequence.

17. The base station of claim 15, wherein the bit selection operation is the puncturing operation, and wherein the transmission bit sequence is selected from index N-E of the circular buffer in sequence.

18. The base station of claim 15, wherein the bit selection operation is the shortening operation, and wherein the transmission bit sequence is selected from index 0 of the circular buffer in sequence.

19. The base station of claim 11, wherein the interleaver further factors the polar code into segments, and wherein the interleaving for different bit selection is coordinated using a sub-block processing.

20. The base station of claim 10, wherein the interleaver further performs a rate-independent interlaced sub-block interleaving for the upper part and the lower part of the polar code.

\* \* \* \* \*